United States Patent
Mannebach et al.

(10) Patent No.: US 11,646,352 B2
(45) Date of Patent: May 9, 2023

(54) STACKED SOURCE-DRAIN-GATE CONNECTION AND PROCESS FOR FORMING SUCH

(71) Applicant: Intel Corporation, Santa Clara, CA (US)

(72) Inventors: Ehren Mannebach, Beaverton, OR (US); Aaron Lilak, Beaverton, OR (US); Hui Jae Yoo, Portland, OR (US); Patrick Morrow, Portland, OR (US); Anh Phan, Beaverton, OR (US); Willy Rachmady, Beaverton, OR (US); Cheng-Ying Huang, Portland, OR (US); Gilbert Dewey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 801 days.

(21) Appl. No.: 16/455,669

(22) Filed: Jun. 27, 2019

(65) Prior Publication Data
US 2020/0411651 A1    Dec. 31, 2020

(51) Int. Cl.
*H01L 29/417* (2006.01)

(52) U.S. Cl.
CPC .. *H01L 29/41741* (2013.01); *H01L 29/41775* (2013.01)

(58) Field of Classification Search
CPC ......... H01L 29/41741; H01L 29/41775; H01L 21/743; H01L 23/485; H01L 29/78696
See application file for complete search history.

(56) References Cited

U.S. PATENT DOCUMENTS

| 8,492,228 | B1 * | 7/2013 | Leobandung | ... H01L 21/823462 |
| | | | | 257/E21.409 |
| 10,504,833 | B2 * | 12/2019 | Zheng | ................. H01L 23/5283 |

* cited by examiner

*Primary Examiner* — Jonathan Han
(74) *Attorney, Agent, or Firm* — Schwabe, Williamson & Wyatt P.C.

(57) ABSTRACT

A device is disclosed. The device includes a first epitaxial region, a second epitaxial region, a first gate region between the first epitaxial region and a second epitaxial region, a first dielectric structure underneath the first epitaxial region, a second dielectric structure underneath the second epitaxial region, a third epitaxial region underneath the first epitaxial region, a fourth epitaxial region underneath the second epitaxial region, and a second gate region between the third epitaxial region and a fourth epitaxial region and below the first gate region. The device also includes, a conductor via extending from the first epitaxial region, through the first dielectric structure and the third epitaxial region, the conductor via narrower at an end of the conductor via that contacts the first epitaxial region than at an opposite end.

25 Claims, 9 Drawing Sheets

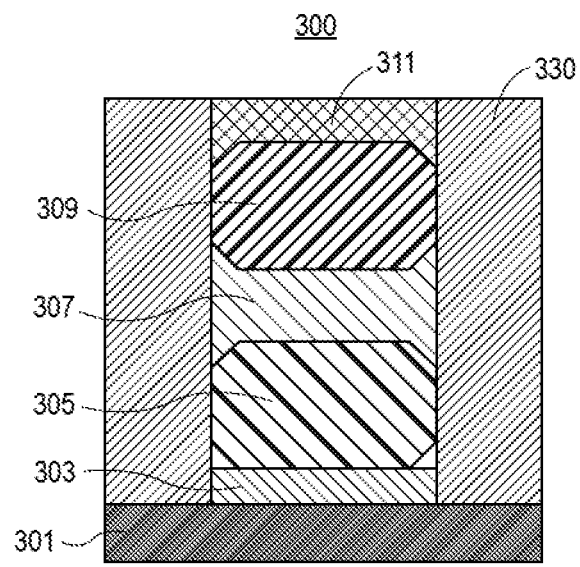
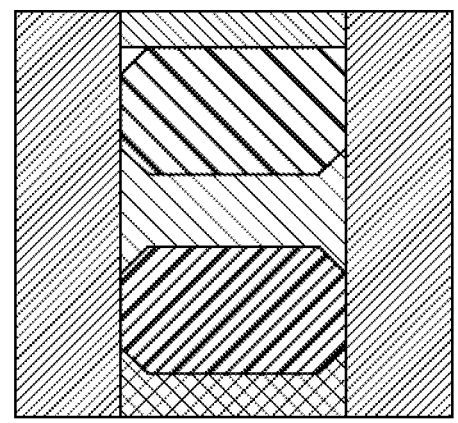
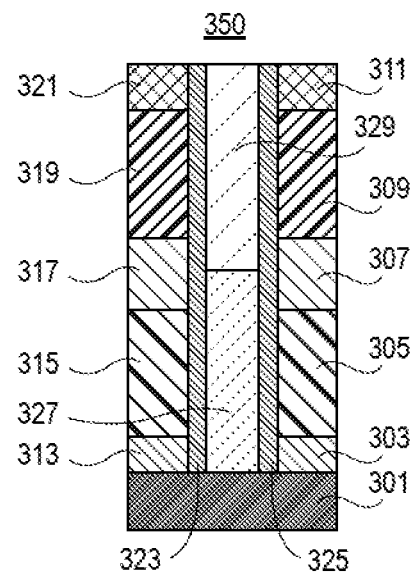
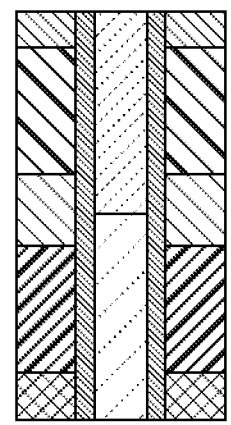
FIG. 3A    FIG. 3B

STACKED SOURCE-DRAIN-GATE CONNECTION AND PROCESS FOR FORMING SUCH

TECHNICAL FIELD

Embodiments of the disclosure pertain to devices having stacked source-drain-gate connections and, in particular, to devices having stacked source-drain-gate connections formed from the backside of the device.

BACKGROUND

Electrically connecting the source-drain regions of two or more monolithically stacked transistors is required as part of the fabrication of many types of electronic circuits. Some solutions to the challenges presented by such involve routing metal around the source and drain regions of the transistors (e.g., wrap-around constructions or through interstitial isolation regions) or etching a via through the top side source-drain epitaxial regions. However, wrap-around vias require significantly more area and can result in a substantially larger die footprint. Moreover, etching through the top side epitaxial region can cause unwanted strain relaxation or loss of body volume. In addition, forming vias to the gate and source-drain regions of a device can cause a significant increase in capacitive coupling between the gate and source-drain regions of the device.

BRIEF DESCRIPTION OF THE DRAWINGS

FIGS. 3A-3E illustrate cross-sections of a semiconductor structure at stages during the process of fabricating a device with a stacked source-drain-gate structure according to an embodiment.

DESCRIPTION OF THE EMBODIMENTS

Figure 1:
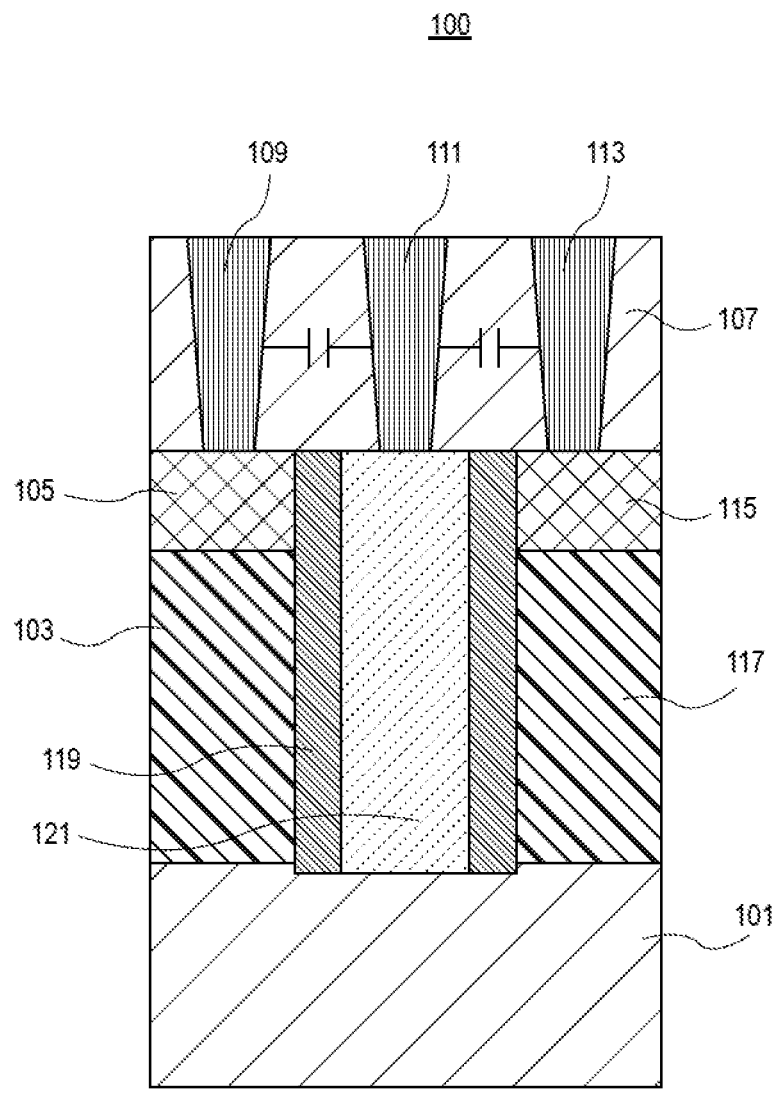
FIG. 1 illustrates a transistor of a previous approach.

A device with a stacked source-drain-gate structure is described. It should be appreciated that although embodiments are described herein with reference to example stacked source-drain-gate structure implementations, the disclosure is more generally applicable to stacked source-drain-gate structure implementations as well as other type stacked source-drain-gate structure implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Electrically connecting the source-drain regions of two or more monolithically stacked transistors is required as part of the fabrication of many types of electronic circuits. Some solutions to the challenges presented by such involve routing metal around the source and drain regions of the transistors (e.g., wrap-around constructions or through interstitial isolation regions) or etching a via through the top side source-drain epitaxial regions. However, wrap-around vias require significantly more area thus can result in a substantially larger die footprint. Moreover, etching through the top side epitaxial region can cause unwanted strain relaxation or loss of body volume. In addition, forming vias to the gate and source-drain regions of a device can cause a significant increase in capacitive coupling between the gate and source-drain regions of the device.

An approach that addresses the shortcomings of previous approaches is disclosed and described herein. In an embodiment, the source-drain regions of two or more monolithically stacked transistors can be electrically connected from the back side of the transistors. For example, in an embodiment, a via can be formed through a bottom source-drain epitaxial region (e.g., doped Si or SiGe in an embodiment) and any dielectric isolation material of the monolithically stacked transistors (two or more layers). In an alternative embodiment, a via can be formed on a single-layer device (e.g., CMOS) if a front-to-back via is needed and the etch cannot be integrated during front side processing. In an embodiment, using such processes, a low resistivity, high contact area contact can be vertically formed between stacked devices. In an embodiment, epitaxial source-drain growth does not need to be seeded from a metal conductor.

Forming the contact to the gate from the backside and to the source-drain from the front-side in either a stacked architecture or a single-strata architecture can minimize the capacitive coupling between the gate and source-drain contacts. The analogous case of forming backside source-drain contacts and front-side gate contacts is an alternative embodiment that can in a similar manner reduce this capacitance. In an embodiment, the reduction of capacitive coupling capacitance enables faster switching and/or lower power consumption.

FIG. 1 illustrates a transistor 100 of a previous approach. In FIG. 1, the transistor 100 includes (shallow trench isolation) STI layer 101, first epitaxial region 103, contact metal 105, interlayer dielectric (ILD) 107, conductor via 109, conductor via 111, conductor via 113, contact metal 115, second epitaxial region 117, gate spacer 119 and gate metal 121.

Referring to FIG. 1, metal conductor via 109 is connected to first epitaxial region 103 through contact metal 105, metal conductor via 111 is connected to gate metal 121 and transistor channel (not shown), and metal conductor via 113 is connected to second epitaxial region 117 through contact metal 115. The metal conductor via 109, the metal conductor via 111 and the metal conductor via 113 are separated by ILD 107. The capacitors (see FIG. 1) that are created by the separation of the metal conductor via 109, the metal conductor via 111 and the metal conductor via 113 by the dielectric ILD 107 material generates a large parasitic capacitance that degrades the performance of the transistor 101. In particular, the source-to-gate and gate-to-drain capacitive coupling that is exhibited reduces switching speed and/or causes increases in transistor power consumption.

Figure 2A:
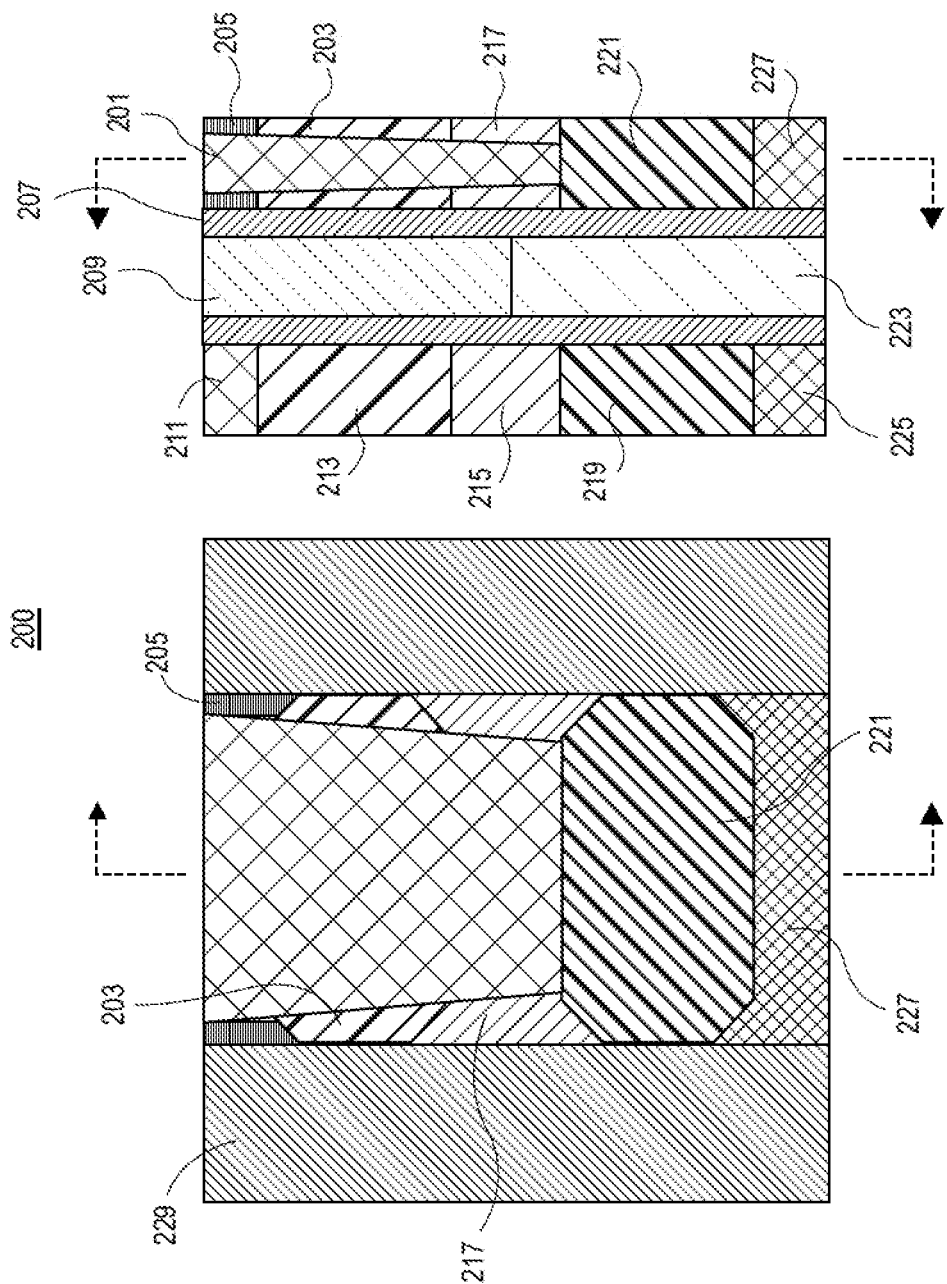
FIG. 2A illustrates a device with a stacked source-drain-gate structure according to an embodiment.

FIG. 2A illustrates a device with a stacked source-drain-gate structure 229 according to an embodiment. It should be appreciated that FIG. 2A shows the completed structure 200 after it has been flipped and the formation of a via completed. As such, the orientation of the structure 200 is shown as rotated by 180 degrees and is the basis for the reference herein to "bottom" structures that are shown at the top of the structure 200 and vice versa. In an embodiment, as shown in FIG. 2A, the device with stacked source-drain-gate 229 can include via 201, bottom epitaxial structure 203, spacer 205, spacer 207, bottom gate conductor 209, bottom contact conductor 211, bottom epitaxial structure 213, dielectric structure 215, dielectric structure 217, top epitaxial structure 219, top epitaxial structure 221, top gate conductor 223, top contact conductor 225, and top contact conductor 227. In FIG. 2A the drawing to the left is a perspective view with a cutline perpendicular to the channel through the source-drain region. The drawing to the right is a perspective view with a cutline parallel to the channel.

Referring to FIG. 2A, in an embodiment, conductor via 201 can be formed on epitaxial structure 221 and can extend through dielectric structure 217, epitaxial structure 203 and spacer 205. In an embodiment, the conductor via 201 can have a width from 6 to 25 nm. In other embodiments, the conductor via 201 can have other widths. In an embodiment, the conductor via 201 can have a length from 5 to 50 nm. In other embodiments, the conductor via 201 can have other lengths. In an embodiment, the conductor via 201 can be tapered. In particular, the conductor via 201 can be narrower at an end adjacent the epitaxial structure 221 than it is at its opposite end. In an embodiment, the bottom epitaxial structure 203 can be formed between dielectric structure 217 and spacer 205. In an embodiment, the bottom epitaxial structure 203 can have a length from 5 to 50 nm. In other embodiments, the bottom epitaxial structure 203 can have other lengths. In an embodiment, the dielectric structure 217 can be formed above the bottom epitaxial structure 203 and below the top epitaxial structure 221 (in right-side-up orientation). In an embodiment, the spacer 205 can be formed below the epitaxial structure 203 and can surround a portion of the conductor via 201 (in right-side-up orientation). In an embodiment, the spacers 207 can be formed adjacent the sides of the top gate conductor 223 and the bottom gate conductor 209. In an embodiment, the bottom gate structure 209 can be formed between the spacers 207. In an embodiment, the bottom contact conductor 211 can be formed below the bottom epitaxial structure 213 (in right-side-up orientation). In an embodiment, the bottom epitaxial structure 213 can be formed above the bottom contact conductor 211 (in right-side-up orientation) and adjacent a portion of the spacers 207. In an embodiment, the length of the epitaxial structure 213 can be from 5 to 50 nm. In other embodiments, the epitaxial structure 213 can have other lengths. In an embodiment, the dielectric structure 215 can be formed above the bottom epitaxial structure 213 and below the top epitaxial structure 219 (in right-side-up orientation). The top epitaxial structure 219 can be formed below the top contact conductor 225 and above the dielectric structure 215 (in right-side-up orientation). In an embodiment, the length of the epitaxial structure 219 can be from 5 to 50 nm. In other embodiments, the epitaxial structure 219 can have other lengths. In an embodiment, the top epitaxial structure 221 can be formed under the top contact conductor 227 and above dielectric structure 217 (in right-side-up orientation). In an embodiment, the length of the epitaxial structure 221 can be from 5 to 50 nm. In other embodiments, the epitaxial structure 221 can have other lengths. In an embodiment, the top gate conductor 223 can be formed above the bottom gate conductor 209 (in right-side-up orientation). In an embodiment, the top contact conductor 225 can be formed above the epitaxial structure 219 (in right-side-up orientation) and adjacent the spacer 207. In an embodiment, the top contact conductor 227 can be formed above the epitaxial structure 221 (in right-side-up orientation) and adjacent the spacer 207.

In an embodiment, through conductor via 201 can be formed from TiN, W, or TaN. In other embodiments, the through conductor via 201 can be formed from other materials. In an embodiment, the bottom epitaxial structure 203 can be formed from Si or SiGe. In other embodiments, the bottom epitaxial structure 203 can be formed from other materials. In an embodiment, the spacer 205 can be formed from SiN or $SiO_2$. In other embodiments, the spacer 205 can be formed from other materials. In an embodiment, the spacers 207 can be formed from SiN or $SiO_2$. In other embodiments, the spacers 207 can be formed from other materials. In an embodiment, the bottom gate conductor 209 can be formed from TiN, W, or TaN. In other embodiments, the bottom gate conductor 209 can be formed from other materials. In an embodiment, the bottom contact conductor 211 can be formed from TiN, W, or TaN. In other embodiment, the bottom contact conductor 211 can be formed from other materials. In an embodiment, the bottom epitaxial structure 213 can be formed from Si or SiGe. In other embodiments, the bottom epitaxial structure 213 can be formed from other materials. In an embodiment, the dielectric structure 215 can be formed from SiN or $SiO_2$. In other embodiments, the dielectric structure 215 can be formed from other materials. In an embodiment, the dielectric structure 217 can be formed from SiN or Sift. In other embodiments, the dielectric structure 217 can be formed from other materials. In an embodiment, the top epitaxial structure 219 can be formed from Si or SiGe. In other embodiments, the top epitaxial structure 219 can be formed from other materials. In an embodiment, the top epitaxial structure 221 can be formed from Si or SiGe. In other embodiments, the top epitaxial structure 221 can be formed from other materials. In an embodiment, the top gate conductor 223 can be formed from TiN, W, or TaN. In other embodiments, the top gate conductor 223 can be formed from other materials. In an embodiment, the top contact conductor 225 can be formed from TiN, W, or TaN. In other embodiments the top contact conductor 225 can be formed from other materials. In an embodiment, the top contact conductor 227 can be formed from TiN, W, or TaN. In other embodiments, the top contact conductor 227 can be formed from other materials.

In operation, because of the low resistivity, high contact area formed between stacked devices of the stacked source-drain-gate structure 200 shown in FIG. 2A, the capacitive coupling between the gate conductors 209 and 223 and the source/drain contacts (e.g., 211, 225 and 227) is minimized and, a reduction in parasitic capacitances relative to previous approaches is realized (see FIG. 1). It should be appreciated that this reduction in parasitic capacitance directly impacts the performance of the transistor. In particular, the reduced parasitic capacitance enables faster switching and/or lower power consumption as compared to previous approaches.

Figure 2B:
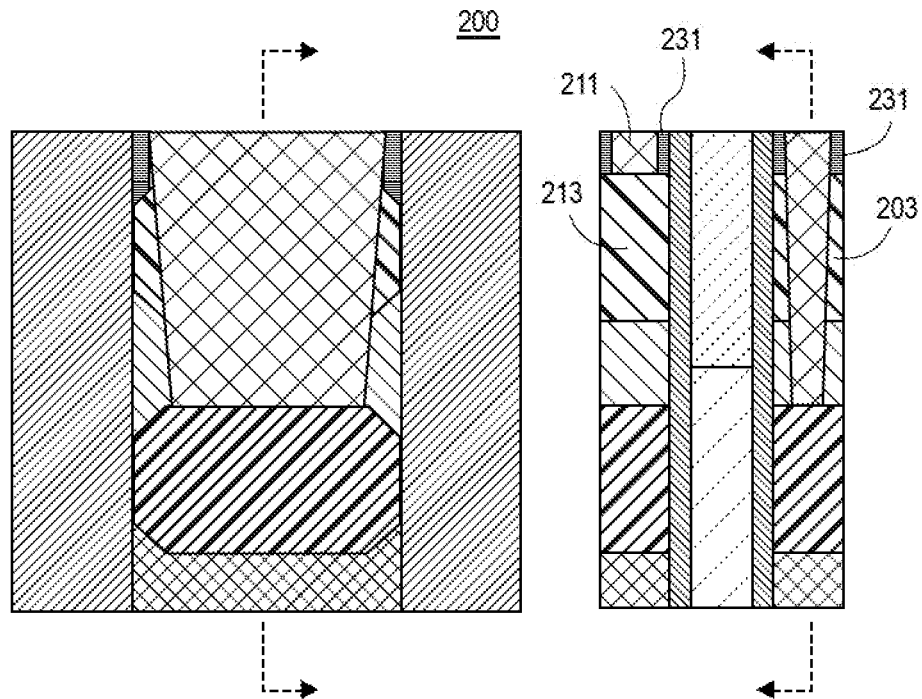
FIG. 2B illustrates a device with a stacked source-drain-gate structure according to an embodiment.

FIG. 2B illustrates a device with stacked source-drain-gate structure 200 according to an embodiment. In the FIG. 2B embodiment, the spacer material can be deposited above the semiconductor structure and can be shaped to form spacers 231 that shadow the epitaxial sidewalls that are located above both the epitaxial region 203 and the epitaxial region 213. In contrast to the embodiment shown in FIG. 2A, the FIG. 2B embodiment can include the spacers 231 above the epitaxial regions 203 and 213. And, can include the contact conductor 211 formed in a via (shown at right) defined by the spacers 231. In FIG. 2B the drawing to the left is a perspective view with a cutline perpendicular to the channel. In FIG. 2B, the drawing to the right is a perspective view with a cutline parallel to the channel through the source-drain region.

Figure 2C:
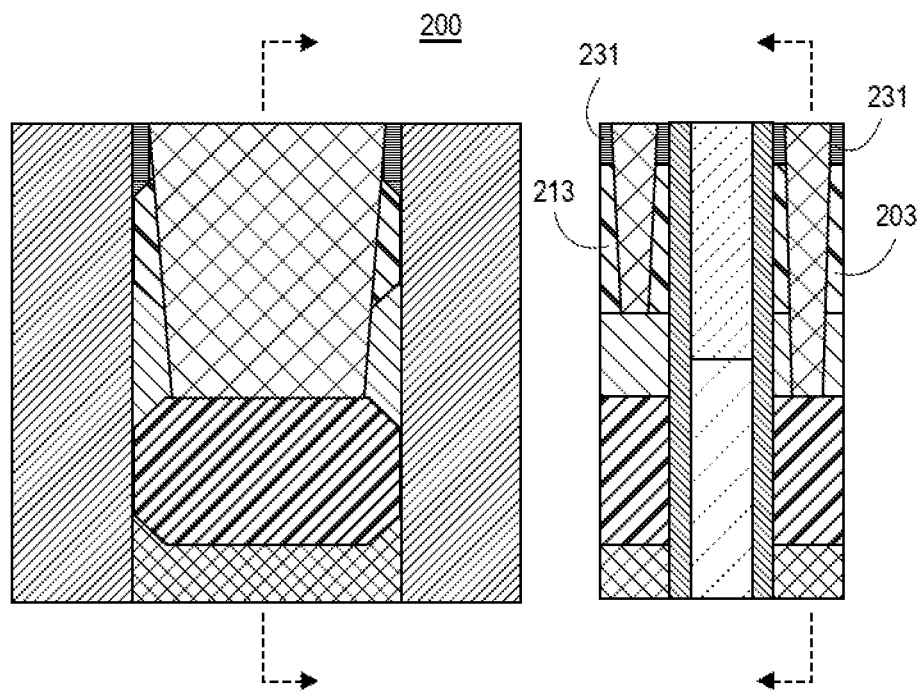
FIG. 2C illustrates a device with a stacked source-drain-gate structure according to an embodiment.

FIG. 2C illustrates a device with stacked source-drain-gate structure 200 according to an embodiment. In the FIG. 2C embodiment, the spacer material can be deposited above the semiconductor structure and can be shaped to form spacers 231 (similar to those of FIG. 2B) that shadow the epitaxial sidewalls that are located above both the epitaxial region 203 and the epitaxial region 213. In contrast to the embodiment shown in FIG. 2A, in FIG. 2C, the spacers 231 shown on the left facilitates a through etch that extends through the epitaxial region 213. In an embodiment, the conductor that is formed in the via formed by the through etch is used to increase contact area and decrease contact resistance. In an embodiment, the spacers 231 that form the through isolation via for the etch can be lithographically defined. In other embodiments, the spacers 231 that form the through isolation via for the etch can be defined in other manners.

FIGS. 2B and 2C show a completed assembly with a conductor via that is formed after the wafer has been flipped and the bottom side of the transistors exposed. It should be noted that the front side interconnects are fully fabricated at this point. In FIGS. 2B and 2C, the top epitaxial region and the bottom epitaxial region correspond to a front side or top and a back side or bottom respectively (e.g., before the wafer is flipped). The process that is performed to build this assembly is shown in FIGS. 3A-3E. FIGS. 2B and 2C include vertical contacts that extend between stacked transistors. Referring to FIGS. 2B and 2C, the left image and right image are cross sections that are cut perpendicular to, and parallel to, the device channel, respectively. The locations of these cross sections are shown by the dashed arrows.

Figure 2D:
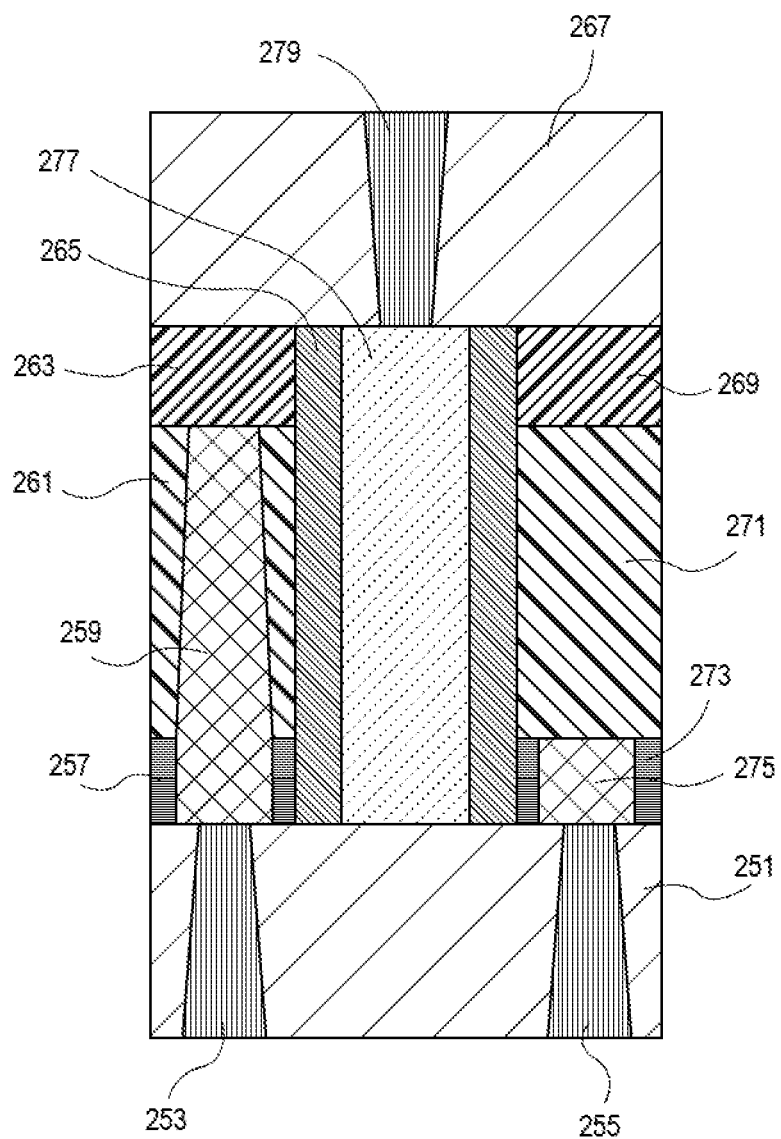
FIG. 2D illustrates a device with a source-drain-gate structure that provides reduced parasitic capacitance according to an embodiment.

FIG. 2D illustrates a single layer transistor according to an embodiment. In FIG. 2D, the transistor includes STI 251, conductor via 253, conductor via 255, spacers 257, conductor contact 259, epitaxial region 261, dielectric structure 263, gate spacers 265, ILD 267, dielectric structure 269, epitaxial region 271, conductor contact 275, spacers 273, gate conductor 277, and via to gate 279.

Referring to FIG. 2D, in an embodiment, conductor via to source-drain region 253 can be connected to first epitaxial region 261 through conductor contact 259. In an embodiment, conductor via to source-drain region 255 can be connected to second epitaxial region 271 through conductor contact 275. In an embodiment, conductor via to gate 279 can be connected to gate conductor 277. In an embodiment, the conductor via to gate 277 and the conductor vias to the source-drain regions 253 and 255 can be on opposite sides of the semiconductor structure. This arrangement reduces the generation of parasitic capacitance that can degrade the performance of the transistor when these structures are located side by side on the same side of the structure (see FIG. 1). In particular, as described herein, the decrease in source-to-gate and gate-to-drain capacitive coupling increases switching speed and/or reduces transistor power consumption.

Figure 3C:
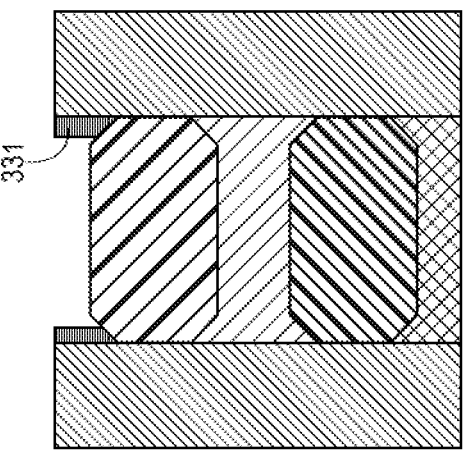
Figure 3C:
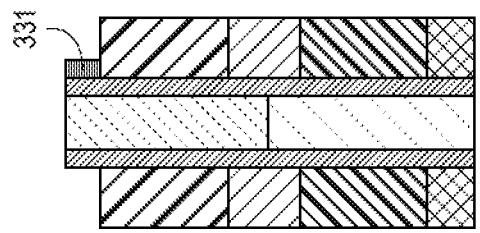

FIGS. 3A-3E shows cross-sections of a semiconductor structure at stages during the fabrication of a stacked source-drain-gate device according to an embodiment. Referring to FIG. 3A, after a plurality of operations the semiconductor structure includes substrate 301, STI 303, epitaxial structure 305, dielectric structure 307, epitaxial structure 309, contact conductor 311, STI 313, epitaxial structure 315, dielectric structure 317, epitaxial structure 319, contact conductor 321, spacer 323, spacer 325, gate conductor 327, gate conductor 329, and isolation wall 330. In FIGS. 3A-3E the drawing at the top of each figure is a perspective view with a cutline perpendicular to the channel through the source-drain region. Moreover, the drawing at the bottom of each figure is a perspective view with a cutline parallel to the channel.

Referring to FIG. 3B, subsequent to one or more operations that result in a cross-section of the structure shown in FIG. 3A, the wafer is flipped and the bottom of the stacked devices (e.g., transistors) are exposed by the removal of the substrate 301.

Referring to FIG. 3C, subsequent to one or more operations that result in the cross-section shown in FIG. 3B, the STI material 303 and 313 is removed and spacers 331 are formed for via formation. In an embodiment, the STI material can be removed by etching processes. In an embodiment, the STI material can be removed by isotropic, anisotropic, plasma etching, ion milling or sputter etching. In other embodiments, the STI material can be removed in other manners. In an embodiment, the spacers 331 can be formed by patterning or deposition processes. In other embodiments, the spacers can be formed in other manners.

Figure 3D:
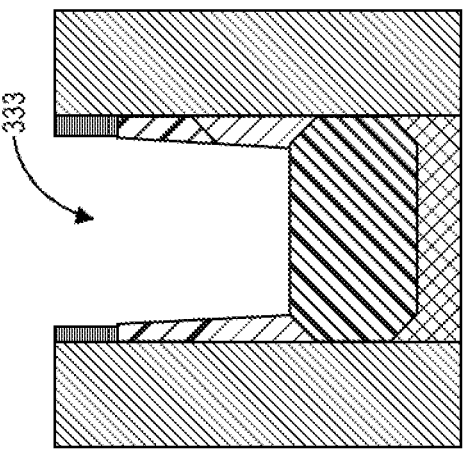
Figure 3D:
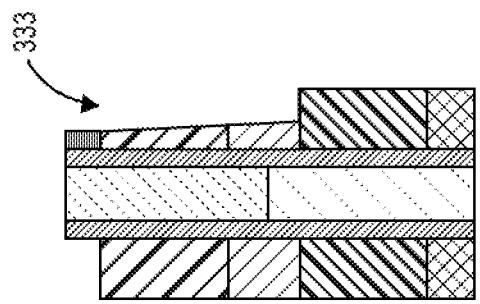

Referring to FIG. 3D, subsequent to one or more operations that result in the cross-section shown in FIG. 3C, a via is formed (the space into which conductor material is formed). In an embodiment, the via can be formed by patterning and etching processes. In an embodiment, the via 333 can be formed by isotropic, anisotropic, plasma etching, ion milling or sputter etching. In other embodiments, the via can be formed in other manners.

Figure 3E:
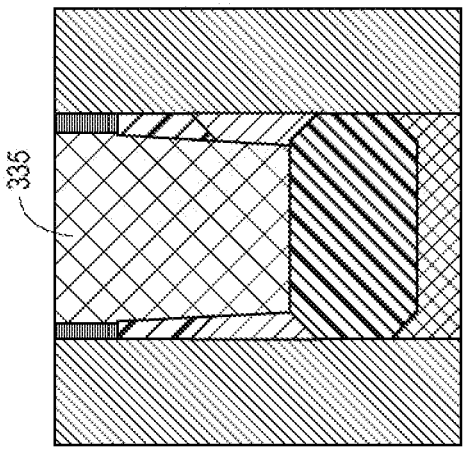
Figure 3E:
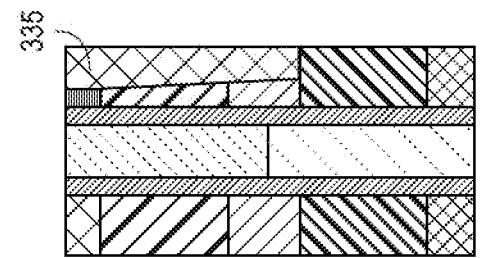

Referring to FIG. 3E, subsequent to one or more operations that result in the cross-section shown in FIG. 3D, the conductor via 335 and the other back side contacts are formed. In an embodiment, the conductor via 335 can be formed by filling the space shown in FIG. 3D. In an embodiment, the conductor via 335 can be formed by atomic layer deposition (ALD), physical vapor deposition (PVD), chemical vapor deposition (CVD), electrochemical deposition (ECD), or molecular beam epitaxy (MBE). In other embodiments, the conductor via 335 can be formed in other manners.

It should be appreciated that the sequence shown in FIG. 3A-3E, begins subsequent to the completion of front side processing. FIG. 3B shows the structure subsequent to the device wafer being flipped and the bottoms of the transistors exposed. As shown in FIG. 3C, after the sub-source-drain material (e.g., STI) is removed, and a spacer is deposited and etched in the regions in which the via is to be formed, the via is lithographically patterned and then etched through the bottom epitaxial and dielectric isolation structures as shown in FIG. 3D. In an embodiment, the sidewalls of the epitaxial material is shadowed by the spacer that is deposited in operations that result in the cross-section shown in FIG. 3C. In FIG. 3E, the via and other back side source-drain contacts are metallized. Thereafter, further processing can be performed.

In an embodiment, the epitaxial boundary is formed in the same plane as the spacer material. In an embodiment, this characteristic is visible in the structure using visual analysis techniques. In an embodiment, the monolithic structure described with reference to FIGS. 2A-2C consist of two transistor layers. However, it is equally applicable to stacks of any number of layers (including single layers). In an embodiment, the process described herein is equally applicable to channels of any shape (e.g. fins, nanowires, nanoribbons, etc.). In the example process of FIGS. 3A-3E, the via shadowing spacer is formed in the source-drain regions that have the via. In other embodiments the via shadowing spacer can be formed in each source-drain region. In the example process of FIGS. 3A-3E, the bottom epitaxial region is etched in the source-drain region where a via is to be formed therein. In other embodiments, the bottom epitaxial regions can be etched in each source-drain region to improve bottom contact area. In such embodiments, the dielectric isolation between the top and bottom epitaxial regions can be etched to form the stacked source-drain connection. FIGS. 3A-3E shows the manner in which a source-drain contact can be formed from the backside of a stacked monolithic structure. In other embodiments, the source-drain contacts can be formed from either the top or the bottom side and the gate contact can be formed from the side opposite that upon which the source-drain contacts are formed.

Figure 4:
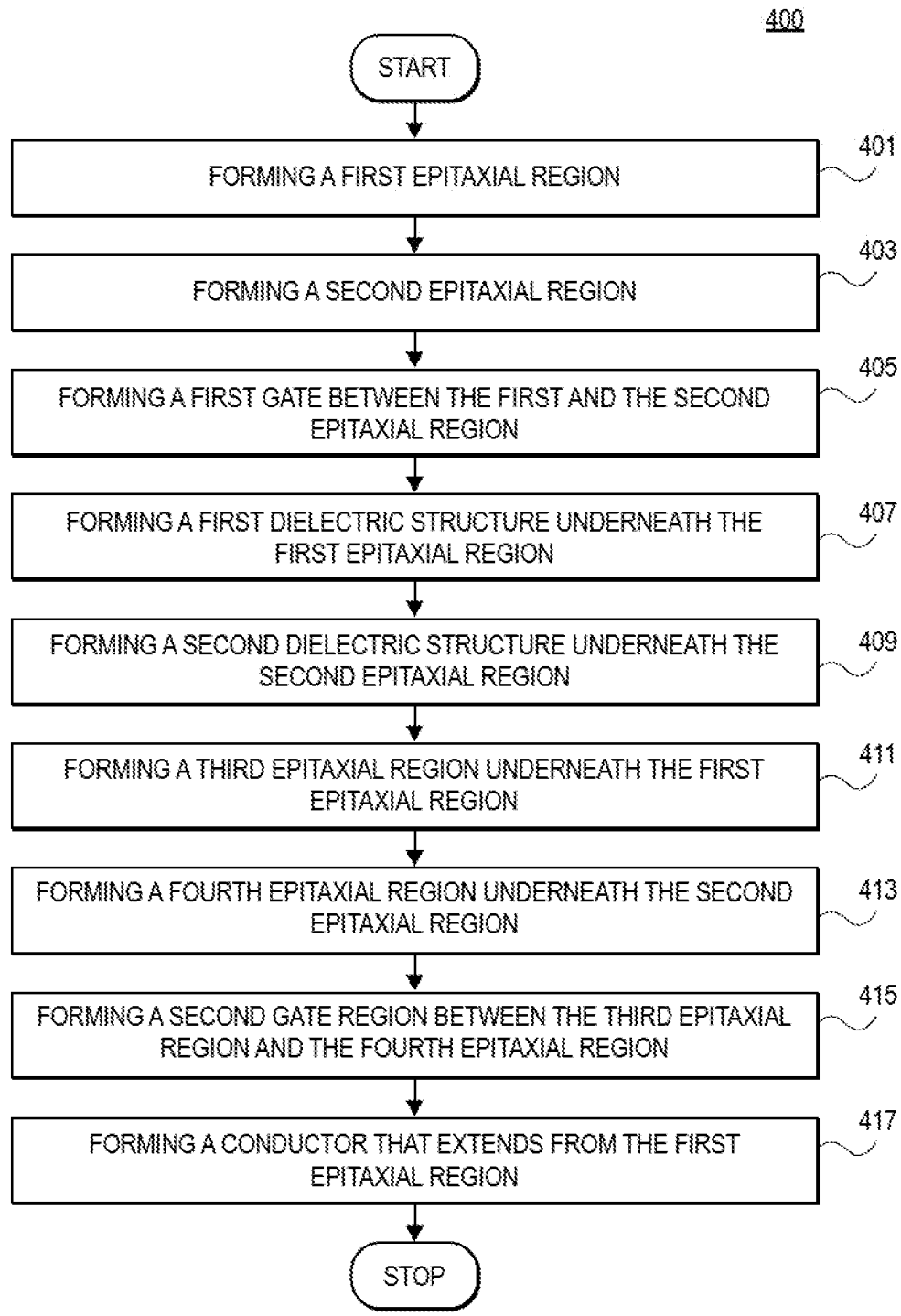
FIG. 4 illustrates a flowchart of a process of fabricating a device with a stacked source-drain-gate structure according to an embodiment.

FIG. 4 illustrates a flowchart of a method for forming a transistor with a stacked source-drain-gate connection according to an embodiment. Referring to FIG. 4, the method includes, at 401, forming a first epitaxial region. At 403, forming a second epitaxial region. At 405, forming a first gate region between the first epitaxial region and a second epitaxial region. At 407, forming a first dielectric structure underneath the first epitaxial region. At 409, forming a second dielectric structure underneath the second epitaxial region. At 411, forming a third epitaxial region underneath the first epitaxial region. At 413, forming a fourth epitaxial region underneath the second epitaxial region. At 415, forming a second gate region between the third epitaxial region and a fourth epitaxial region and below the first gate region. At 417, forming a conductor via extending from the first epitaxial region. In an embodiment, the conductor via extends through the first dielectric structure and the third epitaxial region. In an embodiment, the conductor via is narrower at an end of the conductor via that contacts the first epitaxial region than at an opposite end of the conductor via.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, or carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), or organosilicates such as silsesquioxane, siloxane, or organosilicate glass. The ILD layers may include pores or air gaps to further reduce their dielectric constant.

Figure 5:
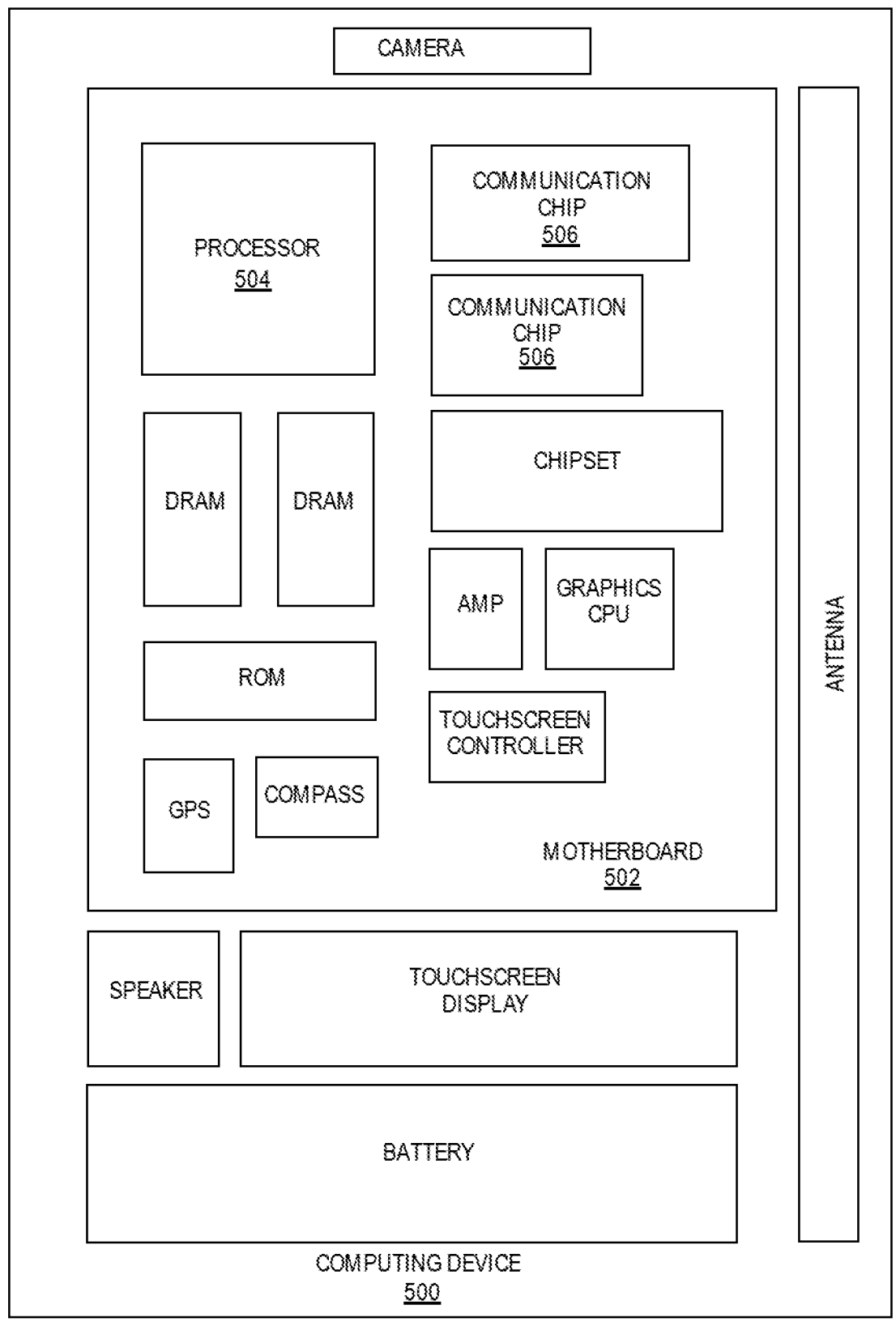
FIG. 5 illustrates a computing device in accordance with one implementation of an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and or logic systems of computing device 500 (such as but not limited to DRAM and/or DRAM that is embedded in logic) can include devices such as transistor structures described herein with reference to FIGS. 2A-2D.

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
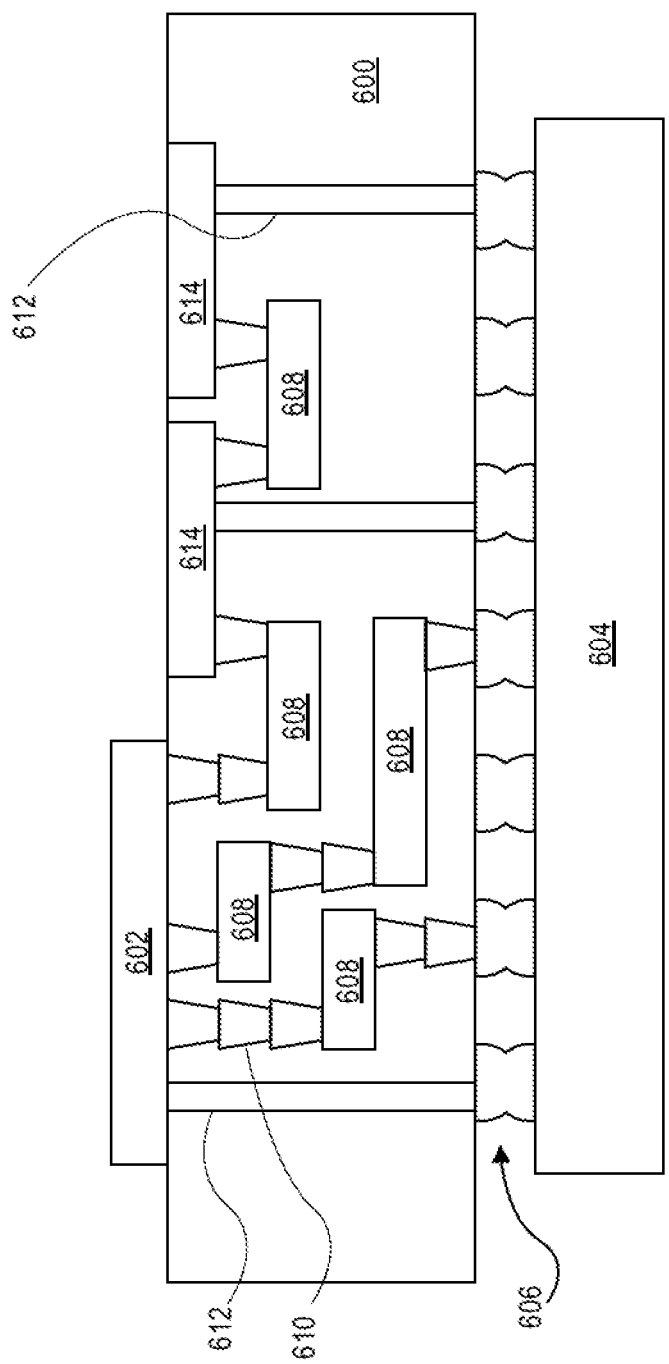
FIG. 6 illustrates an interposer that includes one or more embodiments.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, or other group III-V or group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, or electrostatic discharge (ESD) devices. More complex devices such as radio-frequency (RF) devices, power amplifiers, power management devices, antennas, arrays, sensors, or MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device, comprising: a first epitaxial region; a second epitaxial region; a first gate region between the first epitaxial region and a second epitaxial region; a first dielectric structure underneath the first epitaxial region; a second dielectric structure underneath the second epitaxial region; a third epitaxial region underneath the first epitaxial region; a fourth epitaxial region underneath the second epitaxial region; a second gate region between the third epitaxial region and a fourth epitaxial region and below the first gate region; and a conductor via extending from the first epitaxial region, through the first dielectric structure and the third epitaxial region, the conductor via narrower at an end of the conductor via that contacts the first epitaxial region than at an opposite end.

Example embodiment 2: The device of example embodiment 1, further comprising a second conductor via extending from the second epitaxial region, through the second dielectric structure and the fourth epitaxial region.

Example embodiment 3: The device of example embodiment 1 further comprising a second conductor via extending from the bottom of the second dielectric structure and through the fourth epitaxial region.

Example embodiment 4: The device of example embodiment 1, further comprising a second conductor via extending from the bottom of the fourth epitaxial region.

Example embodiment 5: The device of example embodiment 1, 2, 3, or 4 wherein the first epitaxial region, the second epitaxial region, the third epitaxial region and the fourth epitaxial region are source-drain regions.

Example embodiment 6: The device of example embodiment 1, 2, 3, 4, or 5, wherein a width of the first conductor via is tapered to become wider in the direction extending away from the first epitaxial region.

Example embodiment 7: The device of example embodiment 1, 2, 3, 4, 5, or 6, further comprising one or more spacers wherein a plane of the one or more spacers and an epitaxial boundary of one or more of the first, second, third and fourth epitaxial regions are coplanar.

Example embodiment 8: The device of example embodiment 1, 2, 3, 4, 5, 6, or 7, wherein the width of the first conductor via is from 6 to 25 nm.

Example embodiment 9: The device of example embodiment 1, 2, 3, 4, 5, 6, 7, or 8, wherein the length of the first conductor via is from 5 to 50 nm.

Example embodiment 10: The device of example embodiment claim 1, 2, 3, 4, 5, 6, 7, 8, or 9, wherein the length of first, second, third and fourth epitaxial regions are from 5 to 50 nm.

Example embodiment 11: The device of example embodiment 1, 2, 3, 4, 5, 6, 7, 8, 9, or 10, wherein the semiconductor structure includes a channel that includes a fin, nanowire or nanoribbon.

Example embodiment 12: A device, comprising: a first epitaxial region; a first dielectric structure above the first epitaxial region; a second epitaxial region; a second dielectric structure above the second epitaxial region; a first gate region between the first epitaxial region and a second epitaxial region; a first spacer underneath the first epitaxial region; a second spacer underneath the second epitaxial region; a first conductor via extending from the first dielectric structure through the first epitaxial region and the first spacer; a second conductor via extending from the bottom surface of the second epitaxial region and through the second spacer; and a gate contact via connected to the gate region on a first side of the device, a first source-drain contact via connected to the first conductor via on a second side of the device, and a second source-drain contact via connected to the second conductor via on the second side of the device.

Example embodiment 13: The device of example embodiment 12, further comprising a channel that includes a fin, nanowire or nanoribbon.

Example embodiment 14: A system, comprising: one or more processing components; and one or more data storage components, the data storage components including at least one device, the at least one device including: a first epitaxial region; a second epitaxial region; a first gate region between the first epitaxial region and a second epitaxial region; a first dielectric structure underneath the first epitaxial region; a second dielectric structure underneath the second epitaxial region; a third epitaxial region underneath the first epitaxial region; a fourth epitaxial region underneath the second epitaxial region; a second gate region between the third epitaxial region and a fourth epitaxial region and below the first gate region; and a conductor via extending from the first epitaxial region, through the first dielectric structure and the third epitaxial region, the conductor via narrower at an end that contacts the first epitaxial region than at an opposite end.

Example embodiment 15. The system of example embodiment 14, further comprising a channel that includes a fin, nanowire or nanoribbon.

Example embodiment 16: A method, comprising: flipping a semiconductor structure having one or more source-drain regions wherein a first side of the semiconductor structure is exposed; removing an STI layer; forming spacers for one or more vias; forming one or more vias based on the spacers; and forming a first conductor in the one or more vias that extends through a first source-drain region on the first side of the semiconductor structure to contact a first source-drain region on a second side of the semiconductor structure.

Example embodiment 17: The method of example embodiment 16, wherein the semiconductor structure is a stacked semiconductor structure having one or more transistor layers.

Example embodiment 18: The method of example embodiment 16, further comprising forming a gate contact on a first side of the stacked semiconductor structure and forming the first conductor in the one or more vias on a second side of the stacked semiconductor structure.

Example embodiment 19: The method of example embodiment 16 or 17, wherein a width of the one or more vias is tapered to become wider in the direction extending away from the source-drain region on the second side.

Example embodiment 20: The method of example embodiment 16, or 19, wherein a plane of the spacers and an epitaxial boundary of the one or more source-drain regions are coplanar.

Example embodiment 21: The method of example embodiment 16, 19, or 20, wherein the spacers include spacers that correspond to the one or more source-drain regions.

Example embodiment 22: The method of example embodiment 16, 19, 20, or 21, wherein forming the first conductor includes forming the first conductor to extend through a dielectric isolation structure of the semiconductor structure and connect the first source-drain region on the first side of the semiconductor structure to the first source-drain region on the second side of the semiconductor structure.

Example embodiment 23: The method of example embodiment 16, further comprising forming a conductor in each of the one or more vias through spacers corresponding to each source-drain region on the first side of the semiconductor structure.

Example embodiment 24: The method of example embodiment 16, further comprising forming a second conductor in a second one of the one or more vias to extend through a second source-drain region on the first side of the semiconductor structure to contact a second source-drain region on a second side of the semiconductor structure.

Example embodiment 25: The method of example embodiment 16, further comprising forming a second conductor in a second one of the one or more vias to extend through a second source-drain region on the first side of the semiconductor structure and contact a dielectric structure that isolates the first side of the semiconductor structure and the second side of the semiconductor structure.

Example embodiment 26: The method of example embodiment 16, further comprising forming a second conductor in a second one of the one or more vias to contact the surface of a second source-drain region on the first side of the semiconductor structure.

Example embodiment 27: The method of example embodiment 16, 19, 20, 21, 22, 23, 24, 25, or 26, wherein the semiconductor structure includes a channel that includes a fin, nanowire or nanoribbon.

Example embodiment 28: A method, comprising forming a first epitaxial region; forming a second epitaxial region; forming a first gate region between the first epitaxial region and a second epitaxial region; forming a first dielectric structure underneath the first epitaxial region; forming a second dielectric structure underneath the second epitaxial region; forming a third epitaxial region underneath the first epitaxial region; forming a fourth epitaxial region underneath the second epitaxial region; forming a second gate region between the third epitaxial region and a fourth epitaxial region and below the first gate region; and forming a conductor via extending from the first epitaxial region, through the first dielectric structure and the third epitaxial region, the conductor via narrower at an end of the conductor via that contacts the first epitaxial region than at an opposite end.

Example embodiment 29: The method of example embodiment 28, further comprising forming a second conductor via extending from the second epitaxial region, through the second dielectric structure and the fourth epitaxial region.

Example embodiment 30: The method of example embodiment 28, or 29, further comprising forming a second conductor via extending from the bottom of the second dielectric structure and through the fourth epitaxial region.

Example embodiment 31: The method of example embodiment 28, further comprising forming a second conductor via extending from the bottom of the fourth epitaxial region.

Example embodiment 32: The method of example embodiment 28, 29, or 30, wherein the first epitaxial region, the second epitaxial region, the third epitaxial region and the fourth epitaxial region are source-drain regions.

Example embodiment 33: The method of example embodiment 28, 29, 30, or 32, wherein a width of the first conductor via is tapered to become wider in the direction extending away from the first epitaxial region.

Example embodiment 34: The method of example embodiment 28, further comprising forming one or more spacers wherein a plane of the one or more spacers and an epitaxial boundary of one or more of the first, second, third and fourth epitaxial regions are coplanar.

Example embodiment 35: The method of example embodiment 28, 29, 30, 32, or 33, wherein the width of the first conductor via is from 6 to 25 nm.

Example embodiment 36: The method of example embodiment 28, 29, 30, 32, 33, or 35, wherein the length of the first conductor via is from 5 to 50 nm.

Example embodiment 37: The method of example embodiment 28, 29, 30, 31, 32, 35, or 36, wherein the length of first, second, third and fourth epitaxial regions are from 5 to 50 nm.

Example embodiment 38: The method of example embodiment 28, 29, 30, 32, 33, 35, or 36, wherein the semiconductor structure includes a channel that includes a fin, nanowire or nanoribbon.

What is claimed is:

1. A device, comprising:
a first epitaxial region;
a second epitaxial region;
a first gate region between the first epitaxial region and a second epitaxial region;
a first dielectric structure underneath the first epitaxial region;
a second dielectric structure underneath the second epitaxial region;
a third epitaxial region underneath the first epitaxial region;
a fourth epitaxial region underneath the second epitaxial region;
a second gate region between the third epitaxial region and a fourth epitaxial region and below the first gate region; and
a conductor via extending from the first epitaxial region, through the first dielectric structure and the third epitaxial region, the conductor via narrower at an end of the conductor via that contacts the first epitaxial region than at an opposite end.

2. The device of claim 1, further comprising a second conductor via extending from the second epitaxial region, through the second dielectric structure and the fourth epitaxial region.

3. The device of claim 1, further comprising a second conductor via extending from the bottom of the second dielectric structure and through the fourth epitaxial region.

4. The device of claim 1, further comprising a second conductor via extending from the bottom of the fourth epitaxial region.

5. The device of claim 1, wherein the first epitaxial region, the second epitaxial region, the third epitaxial region and the fourth epitaxial region are source-drain regions.

6. The device of claim 1, wherein a width of the first conductor via is tapered to become wider in the direction extending away from the first epitaxial region.

7. The device of claim 1, further comprising one or more spacers wherein a plane of the one or more spacers and an epitaxial boundary of one or more of the first, second, third and fourth epitaxial regions are coplanar.

8. The device of claim 1, wherein the width of the first conductor via is from 6 to 25 nm.

9. The device of claim 1, wherein the length of the first conductor via is from 5 to 50 nm.

10. The device of claim 1, wherein the length of first, second, third and fourth epitaxial regions are from 5 to 50 nm.

11. The device of claim 1, further comprising a channel that includes a fin, nanowire or nanoribbon.

12. A device, comprising:
a first epitaxial region;
a first dielectric structure above the first epitaxial region;
a second epitaxial region;
a second dielectric structure above the second epitaxial region;
a first gate region between the first epitaxial region and a second epitaxial region;
a first spacer underneath the first epitaxial region;
a second spacer underneath the second epitaxial region;
a first conductor via extending from the first dielectric structure through the first epitaxial region and the first spacer;
a second conductor via extending from the bottom surface of the second epitaxial region and through the second spacer; and
a gate contact via connected to the gate region on a first side of the device, a first source-drain contact via connected to the first conductor via on a second side of the device, and a second source-drain contact via connected to the second conductor via on the second side of the device.

13. The device of claim 12, further comprising a channel that includes a fin, nanowire or nanoribbon.

14. A system, comprising:
one or more processing components; and
one or more data storage components, the data storage components including at least one device, the at least one device including:
a first epitaxial region;
a second epitaxial region;
a first gate region between the first epitaxial region and a second epitaxial region;
a first dielectric structure underneath the first epitaxial region;
a second dielectric structure underneath the second epitaxial region;
a third epitaxial region underneath the first epitaxial region;
a fourth epitaxial region underneath the second epitaxial region;
a second gate region between the third epitaxial region and a fourth epitaxial region and below the first gate region; and
a conductor via extending from the first epitaxial region, through the first dielectric structure and the third epitaxial region, the conductor via narrower at an end that contacts the first epitaxial region than at an opposite end.

15. The system of claim 14, further comprising a channel that includes a fin, nanowire or nanoribbon.

16. A method, comprising:
flipping a semiconductor structure having one or more source-drain regions wherein a first side of the semiconductor structure is exposed;
removing an (STI) shallow trench isolation layer;
forming spacers for one or more vias;
forming one or more vias based on the spacers; and
forming a first conductor in the one or more vias that extends through a first source-drain region on the first side of the semiconductor structure to contact a first source-drain region on a second side of the semiconductor structure.

17. The method of claim 16, wherein the semiconductor structure is a stacked semiconductor structure having one or more transistor layers.

18. The method of claim 16, further comprising forming a gate contact on a first side of the stacked semiconductor structure and forming the first conductor in the one or more vias on a second side of the stacked semiconductor structure.

19. The method of claim 16, wherein a width of the one or more vias is tapered to become wider in the direction extending away from the source-drain region on the second side.

20. The method of claim 16, wherein a plane of the spacers and an epitaxial boundary of the one or more source-drain regions are coplanar.

21. The method of claim 16, wherein the spacers include spacers that correspond to the one or more source-drain regions.

22. The method of claim 16, wherein forming the first conductor includes forming the first conductor to extend through a dielectric isolation structure of the semiconductor structure and connect the first source-drain region on the first side of the semiconductor structure to the first source-drain region on the second side of the semiconductor structure.

23. The method of claim 16, further comprising forming a conductor in each of the one or more vias through spacers corresponding to each source-drain region on the first side of the semiconductor structure.

24. The method of claim 16, further comprising forming a second conductor in a second one of the one or more vias to extend through a second source-drain region on the first side of the semiconductor structure to contact a second source-drain region on a second side of the semiconductor structure.

25. The method of claim 16, further comprising forming a second conductor in a second one of the one or more vias to extend through a second source-drain region on the first side of the semiconductor structure and contact a dielectric structure that isolates the first side of the semiconductor structure and the second side of the semiconductor structure.

* * * * *